United States Patent [19]

Tessier et al.

[11] Patent Number: 5,201,875
[45] Date of Patent: Apr. 13, 1993

[54] PROBE AND INVERTING APPARATUS

[75] Inventors: Robert R. Tessier, White Bear Lake; Dennis H. Jensen; Jeffrey J. Hertz, both of Blaine, all of Minn.

[73] Assignee: Aetrium, Inc., North St. Paul, Minn.

[21] Appl. No.: 740,146

[22] Filed: Aug. 5, 1991

Related U.S. Application Data

[63] Continuation-in-part of Ser. No. 466,015, Jan. 16, 1990, which is a continuation-in-part of PCT/US91/00288 filed Jan. 15, 1991, abandoned.

[51] Int. Cl.⁵ .......................... B66C 1/02; B25J 15/06
[52] U.S. Cl. ..................................... 294/64.1; 294/88; 29/743
[58] Field of Search ............... 294/2, 64.1, 88; 29/743; 901/40; 92/177; 414/627, 737

[56] References Cited

U.S. PATENT DOCUMENTS

| | | | |
|---|---|---|---|
| 2,177,967 | 10/1939 | Watkins | 294/64.1 X |
| 3,467,430 | 9/1969 | Lowe | 294/64.1 X |
| 3,815,480 | 6/1974 | Spyra | 92/177 X |
| 4,080,877 | 3/1978 | de Fries | 92/177 X |
| 4,266,905 | 5/1981 | Birk et al. | 294/64.1 X |
| 4,657,470 | 4/1987 | Clarke et al. | 901/40 X |
| 4,843,712 | 7/1989 | Hellstern | |
| 4,957,212 | 9/1990 | Dück et al. | 92/177 X |
| 4,995,662 | 2/1991 | Hawkswell | 294/64.1 |
| 5,050,919 | 9/1991 | Yakou | 294/64.1 X |

FOREIGN PATENT DOCUMENTS

| | | |
|---|---|---|
| 0166409 | 1/1986 | European Pat. Off. |
| 0253015 | 1/1988 | European Pat. Off. |
| 2604984 | 4/1988 | France ........................ 294/64.1 |

Primary Examiner—Charles A. Marmor
Assistant Examiner—Dean J. Kramer
Attorney, Agent, or Firm—Peterson, Wicks, Nemer & Kamrath

[57] ABSTRACT

An invertor (10) is disclosed including first and second probes (12, 14) which are pivotably mounted to a U-shaped housing (20) and to a block (18) which is reciprocally mounted to the housing (20) by guide shafts (38). The block (18) is reciprocated by a rotary actuator (42) between a first position where the probes (12, 14) are in a parallel relation and a second position where the probes (12, 14) are in line. The suction pin (80) of the first probe (12) may be extended to attach to the first surface (96) of the chip (98) and then retracted. The probes (12, 14) may then be moved to their in line relation where the chip (98) may be passed from the first probe (12) to the second probe (14) but attaching the opposing surface (100) of the chip (98) to the suction pin (80) of the second probe (14). After moving the probes (12, 14) to their parallel relation, the suction pin (80) of the second probe (14) may be extended to place and release the chip (98). In the most preferred form, probes (12, 14) include a housing (72) divided into upper and lower chambers (74, 76) by an insert (78) which also reciprocally receives the suction pin (80). The suction pin (80) includes a piston (86) to define a pressure chamber (88) with the insert (78). Chambers (74, 88) may be subjected to fluid pressure, vacuum, or vented to attach the suction pin (80) to the chip (98) and/or to reciprocate the suction pin (80) within the housing (72).

17 Claims, 2 Drawing Sheets

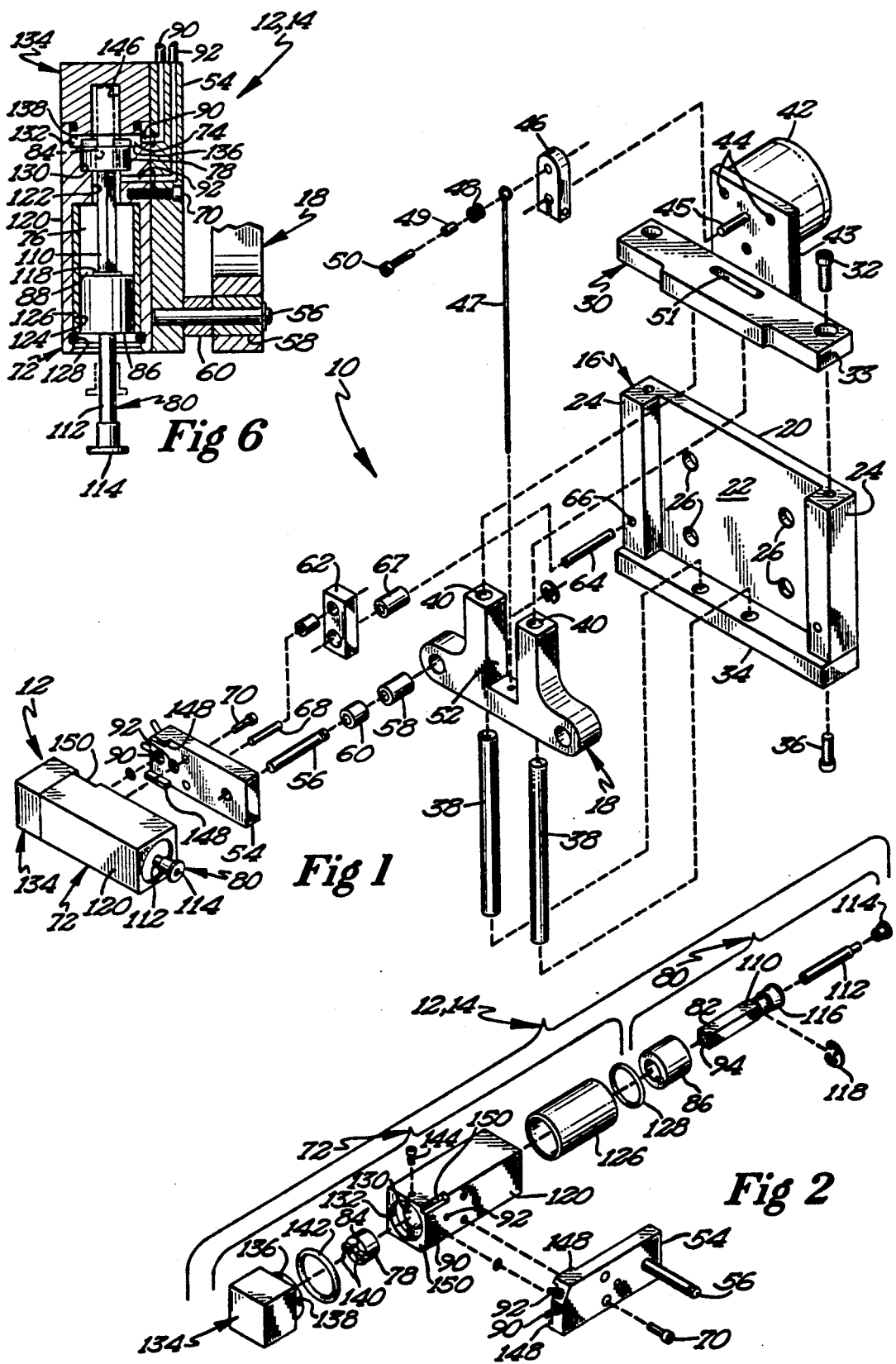

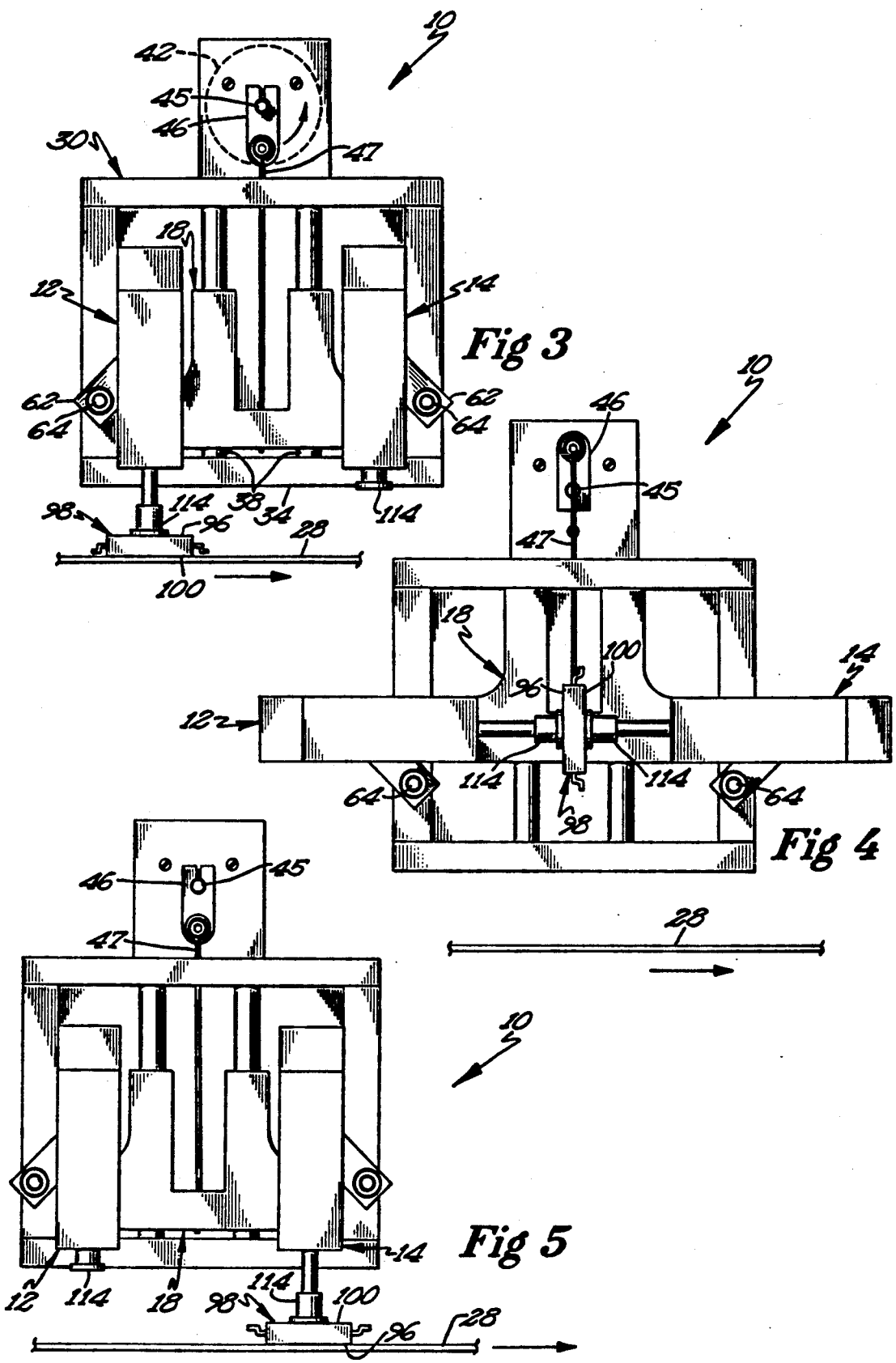

PROBE AND INVERTING APPARATUS

CROSS REFERENCE

This application is a continuation of international application No. PCT/US 91/00288 filed Jan. 15, 1991 which in turn is a continuation-in-part of U.S. application Ser. No. 466,015 filed Jan. 16, 1990 now abandoned.

BACKGROUND

The present invention relates generally to devices for handling articles such as computer chips and particularly to inverting apparatus and to pick up probes.

During the manufacture of articles such as computer chips, such articles must be tested for operability, efficiency, and other conditions. It is especially desirable to automate such testing to reduce the amount of labor required in performing such tests. Thus, a need exists for devices which mechanically handle such articles to allow automated testing. This need includes devices or probes which are able to pick up and/or place such articles at desired locations and which do not have a tendency to damage such articles including delicate parts thereof such as the connecting leads on a computer chip. This need also includes devices for inverting such articles to allow automated testing on both sides of the article, which devices also not having a tendency to damage such articles including delicate parts thereof such as the connecting leads on a computer chip.

SUMMARY

The present invention solves these needs and other problems in the field of chip handling by providing, in the most preferred form, a method for inverting an article where the first surface of an article is attached and then moved in a first direction. The article is then tipped 90° and the second opposing surface is then attached. After release of the first surface, the article is then again tipped 90°. After moving the article in a direction opposite to the first direction, the second surface of the article is released, with the article being inverted from its initial position.

In a preferred form, the article is inverted by an apparatus which selectively positions first and second probes between a first, parallel relation and a second, in line relation, with the probes including reciprocal pins for removable attachment to the article. In a most preferred form, the probes are pivotably mounted to a housing and to a block which is reciprocally mounted relative to the housing, with the probes being simultaneously pivoted as the block is reciprocated between first and second positions.

In a further aspect of the present invention, a probe is provided including a pin reciprocally mounted in a housing for reciprocation in upper and lower chambers. The pin includes a piston which defines a pressure chamber in the lower chamber and includes an internal passage in fluid communication with the upper chamber. Fluid communication is provided to the upper chamber and the pressure chamber for removably attaching an article to the pin and/or for reciprocating the pin within the housing.

It is thus an object of the present invention to provide a novel inverting method.

It is thus an object of the present invention to provide a novel inverting apparatus.

It is thus an object of the present invention to provide a novel probe.

It is further an object of the present invention to provide such a novel probe including a reciprocating pin which only retracts when an article is attached thereto.

It is further an object of the present invention to provide such a novel probe which utilizes fluid pressure and vacuum acting on a piston to reciprocate the pin.

It is further an object of the present invention to provide such a novel probe having a volume reducing chamber from the pin retracting into the chamber.

It is further an object of the present invention to provide such a novel probe providing very soft handling of the article.

It is further an object of the present invention to provide such novel inverting method and apparatus providing very soft handling of the article.

It is further an object of the present invention to provide such novel inverting method and apparatus of a relatively simple design.

It is further an object of the present invention to provide such novel inverting method and apparatus which passes the article between first and second probes movable between parallel and in line positions.

These and further objects and advantages of the present invention will become clearer in light of the following detailed description of an illustrative embodiment of this invention described in connection with the drawings.

DESCRIPTION OF THE DRAWINGS

The illustrative embodiment may best be described by reference to the accompanying drawings where:

FIG. 1 shows an exploded, perspective view of an invertor including probes according to the preferred teachings of the present invention.

FIG. 2 shows an exploded, perspective view of the probe of FIG. 1.

FIGS. 3-5 show front views of the invertor of FIG. 1.

FIG. 6 shows a cross sectional view of the probe of FIG. 1.

All figures are drawn for ease of explanation of the basic teachings of the present invention only; the extensions of the figures with respect to number, position, relationship, and dimensions of the parts to form the preferred embodiment will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "vertical", "horizontal", "central", "upper", "side", "end", and similar terms are used herein, it should be understood that these terms have reference only to the structure shown in the drawings as it would appear to a person viewing the drawings and are utilized only to facilitate describing the invention.

DESCRIPTION

An apparatus for inverting an article such as a chip on a conveyor or the like according to the preferred teachings of the present invention is shown in the drawings and generally designated 10. Inverter 10 generally includes first and second probes 12 and 14 which are pivotably mounted to a stationary mount 16 and to a reciprocating block 18.

In the most preferred form, mount 16 includes a U-shaped housing 20 including a central plate 22 and first and second upstanding legs 24. Suitable provisions 26 such as mounting apertures are provided for mounting housing 22 in a stationary condition relative to conveyor 28. An L-shaped actuator mounting plate 30 is secured to the upper end of housing 22 such as by screws 32 extending through the horizontal leg 33 of plate 30. A lower end plate 34 is secured to the opposite end of housing 22 such as by screws 36. First and second guide shafts 38 are mounted and extend between horizontal leg 33 of plate 30 and plate 34 parallel to and spaced from each other, from plate 22, and from legs 24. It should be appreciated that guide shafts 38 may be mounted in any suitable manner such as being press fit in and upstanding from plate 34 or from horizontal leg 33 of plate 30, may be slideably captured between horizontal leg 33 of plate 30 and plate 34, or may be similarly mounted.

Block 18 in the most preferred form is generally an inverted T-shape and is reciprocally mounted on guide shafts 38 such as by passages 40 formed in block 18 for slideably receiving guide shafts 38. Block 18 is reciprocated on guide shafts 38 within housing 20 by a rotary actuator 42 mounted to the vertical leg 43 of plate 30 such as by screws 44. In the preferred form, the output shaft 45 of actuator 42 passes through a bore formed in vertical leg 43 of plate 30 and is rotatably secured to an end of a crank arm 46. The first end of a connecting wire 47 is rotatably secured to the opposite end of crank arm 46 such as by being secured to a ring 48 rotatably mounted by a bushing 49 located on a screw 50 threadably received adjacent the free end of crank arm 46. Wire 47 extends from crank arm 46 through a bore 51 formed in horizontal leg 33 of plate 30 and has its opposite end secured to block 18. In the preferred form, a channel 52 is formed in block 18 parallel to and intermediate passages 40, with wire 47 being attached to the head of block 18 in the closed end of channel 52.

In the most preferred form, rotary actuator 42 rotates output shaft 45 180° and specifically between a first position wherein crank arm 46 is generally vertical with ring 48 located below output shaft 45 and a second position wherein crank arm 46 is generally vertical with ring 48 located above output shaft 45. It can then be appreciated that due to the connection of wire 47 between the free end of crank arm 46 and block 18, as output shaft 45 is rotated, block 18 reciprocates on guide shafts 38 between a first position adjacent to end plate 34 and a second position adjacent to plate 30. It should then be appreciated that suitable bumpers may be provided on plate 30 and/or 34 to act as shock absorbers to reduce the force at which block 18 may engage plate 30 and/or 34.

Mounting blocks 54 are pivotally mounted on the opposite sides of block 18 such as by pivot pins 56 press fit in blocks 54 and rotatably received in bearings 58 secured in block 18, with a spacer 60 intermediate block 18 and block 54. Pivot links 62 are pivotally mounted on the opposite sides of housing 20 such as by pivot pins 64 received in bores 66 formed in legs 24 of housing 20 and in bearings 67 secured in pivot links 62. Pivot links 62 are pivotally mounted to mounting blocks 54 by dowel pins 68 press fit in block 54 and rotatably received in a bearing secured in link 62. Probes 12 and 14 are mounted on mounting blocks 54 on opposite sides of block 18 such as by screws 70.

It can then be appreciated that due to the pivotal mounting of probes 12 and 14 about stationary pivot pins 64 and about movable pivot pins 56, the positioning of probes 12 and 14 relative to each other changes with the reciprocation of block 18 within housing 20 by actuator 42. Specifically, and in the preferred form, with block 18 in its first position adjacent end plate 34, probes 12 and 14 are in a vertical, parallel relation. However, with the rotation of actuator 42 moving block 18 to its second position adjacent plate 30, probes 12 and 14 are in a horizontal, in line relation.

Inverter 10 according to the preferred teachings of the present invention also includes probes 12 and 14 of a unique and advantageous construction. Specifically, probes 12 and 14 generally include a housing 72 divided to define an upper air chamber 74 and a lower chamber 76 by an insert 78. Probes 12 and 14 further include a suction pin 80 slideably mounted in insert 78 and reciprocal in chambers 74 and 76. In the most preferred form, suction pin 80 includes an upper portion 82 having a square or other non-circular cross section, with insert 78 having a passage 84 of a complementary configuration to prevent rotation of suction pin 80 within housing 72 and insert 78. A piston 86 is secured to suction pin 80 for reciprocation within chamber 76 for defining a lower air chamber 88 between insert 78 and piston 86. Suitable provisions 90 and 92 such as ports are provided to allow fluid communication to chambers 74 and 88. Pin 80 includes an internal passage 94 in communication with air chamber 74.

In the most preferred form, suction pin 80 includes a sleeve 110 which removably receives and is in fluid communication with a probe tip 112 having a suitable suction cup 114, with probe tips 112 and cups 114 being of various types and configurations. Sleeve 110 includes upper portion 82 and a lower portion 116, with piston 86 being slideably received on and sealing with portion 116. Suitable provisions such as a snap ring 118 received in a groove formed in sleeve 110 may be provided for holding piston 86 in place on sleeve 110.

In the most preferred form, housing 72 is formed by a chamber portion 120 including a through passage 122. A first enlarged bore 124 extends from the first end of portion 120 concentric with passage 122 and terminating at a location spaced from the second end of portion 120. Piston 86 is reciprocally received in a cylinder tube 126 which in turn is slideably received in bore 124. Tube 126 is held in bore 124 by an O-ring 128 received in a groove formed in chamber portion 120, with O-ring 128 also sealing tube 126 with bore 124 and also acting as a stop to prevent piston 86 from sliding out the free end of cylinder tube 126. It can then be appreciated that tube 126 can be formed of low friction material such as pyrex glass and piston 86 can be similarly formed of low friction material such as carbon which facilitates reciprocation of piston 86 in tube 126 and which allows reduced tolerance requirements for bore 124 such that housing 72 may be easily formed of aluminum.

Chamber portion 120 includes a second enlarged bore 130 extending from the second end of portion 120 concentric with passage 122 and terminating at a location spaced from bore 124. Chamber portion 120 further includes a third enlarged bore 132 extending from the second end of portion 120 concentric with passage 122 and bore 130 and terminates at a location spaced from bore 124 and the termination of bore 130, with bore 132 being larger than bore 130. Insert 78 is of a size and shape complementary to, for slideable receipt in, and for sealing with bore 130.

Housing 72 is further formed by a top portion 134 according to the preferred teachings of the present invention having an outside configuration generally the same as chamber portion 120. The lower end of top portion 134 includes a removed portion to define a projecting lip 136 having a radial size complementary to but slightly smaller than bore 132 and a length generally equal to the depth of bore 132. Lip 136 includes a diagonal key slot 138 of a depth less than the height that lip 136 projects from top portion 134. Insert 78 includes upstanding tabs 140 which extend into bore 132 and are received within key slot 138 to prevent relative rotation of insert 78 with respect to top portion 134 and thus of housing 72, with the height of tabs 140 being less than the depth of key slot 138 to provide a fluid path therebetween. Suitable sealing means such as an O-ring 142 is provided between bore 132 and lip 136. Top portion 134 may be secured to chamber portion 120 by suitable means such as screws 144 extending through chamber portion 120 and threadably received in lip 136 of top portion 134. A bore 146 is provided in top portion 134 generally contiguous and in line with passage 122 for reciprocal receipt of upper portion 82 of sleeve 110.

In the most preferred form, mounting block 54 includes parallel mounting ears 148 which are slideably received in slots 150 formed in chamber portion 120 for maintaining the relative position thereof when probes 12 and 14 are secured by screws 70 extending through mounting block 54 and threadably received in chamber portion 120. It can be appreciated that mounting block 54 includes suitable passages for fluid communication with ports 90 and 92 of housing 72 of probes 12 and 14.

It can then be appreciated that pin 80 can be reciprocated in housing 72 by applying fluid pressure to chamber 88 to extend pin 80 from housing 72 or by withdrawing fluid pressure under a vacuum to chamber 88 to retract pin 80 into housing 72. It can further be appreciated that fluid pressure can be applied to chamber 74 such that fluid pressure will pass through passage 94 of pin 80 and that fluid pressure can be withdrawn under a vacuum from chamber 74 such that passage 94 of pin 80 is likewise under vacuum. It should then be appreciated that if passage 94 is blocked such as by a chip 98 attached to the lower end of pin 80, pin 80 will be biased to retract into housing 72 to reduce the overall volume of chamber 74 and passage 94 under a vacuum force.

Now that the basic construction of invertor 10 and probes 12 and 14 has been explained, the operation, subtle features, and advantages thereof can be set forth and appreciated. For purposes of explanation, it will be assumed that block 18 is in its first position with probes 12 and 14 in their vertical, parallel relation and that pins 80 are retracted within housings 72 of probes 12 and 14. Fluid pressure may be introduced into chamber 88 through port 92 of probe 12 to extend pin 80 of probe 12. Prior to or when the lower end of pin 80 engages the upper surface 96 of a chip 98 on a conveyor 28 or the like, chamber 74 of probe 12 may be subjected to a vacuum to attach surface 96 of chip 98 to pin 80. After attachment, fluid pressure to chamber 88 of probe 12 may be terminated and chamber 88 may be vented. With the venting of chamber 88, pin 80 will retract in a first direction generally perpendicular to surface 96 into housing 72 of probe 12 under the vacuum force of chamber 74. After pin 80 of probe 12 is retracted, block 18 may be reciprocated to its second position by actuator 42 such that probes 12 and 14 are in their horizontal, in line relation and chip 98 is tipped 90° with surface 96 being parallel to the first, retraction direction of probe 12. At that time, pin 80 of probe 12 may be extended in a direction which is perpendicular to the first, retraction direction of probe 12 by applying fluid pressure to chamber 88. Pin 80 of probe 14 may also be extended in a direction which is perpendicular to the first, retraction direction of probe 12 by applying fluid pressure to chamber 88 so that pin 80 of probe 14 abuts the lower surface 100 of chip 98 which is opposing surface 96. Prior to or when pin 80 of probe 14 engages surface 100, chamber 74 of probe 14 may be subjected to a vacuum to attach surface 100 of chip 98 to pin 80 of probe 14. After attachment to pin 80 of probe 14, the vacuum to chamber 74 of probe 12 may be discontinued and chamber 74 of probe 12 may be vented to release the attachment of pin 80 of probe 12 to chip 98. After attachment to probe 14, fluid pressure to chamber 88 of probe 14 may be terminated and chamber 88 of probe 14 may be vented. With the venting of chamber 88 of probe 14, pin 80 of probe 14 will retract into housing 72 of probe 14 under the vacuum force of chamber 74 of probe 14. After release, a vacuum may be introduced into chamber 88 of probe 12 to retract pin 80 within housing 72 of probe 12. After the retraction of pins 80 of probes 12 and 14, block 18 may be reciprocated to its first position by actuator 42 such that probes 12 and 14 are in their vertical, parallel relation and chip 98 is tipped 90° with surface 100 being perpendicular to the first, retraction direction of probe 12. At that time, pin 80 or probe 14 may be extended in a direction opposite to the first, retraction direction of probe 12 by applying fluid pressure to chamber 88 until surface 96 of chip 98 engages conveyor 28 and surface 100 now being on top. At that time, the vacuum to chamber 74 of probe 14 may be discontinued to release chip 98, with chamber 74 of probe 14 either being vented or subjected to a puff of fluid pressure to push chip 98 away from the lower end of pin 80. After release, pin 80 of probe 14 may be retracted by placing chamber 88 of probe 14 under a vacuum. At that time, chip 98 may be conveyed on conveyor 28 but in an inverted condition.

It can then be appreciated that invertor 10 is able to invert chip 98 utilizing a relatively simple mechanism which does not attach to or utilize the chip leads in the inverting method. Thus, invertor 10 is not as prone to chip damage or breakage as in prior inverting apparatus.

The configuration of block 18 is believed to be advantageous according to the preferred teachings of the present invention. Specifically, channel 52 allows the nesting of wire 47 such that the overall height of invertor 10 can be reduced while the length of passages 40 can be maximized to allow free reciprocation of block 18 on guide shafts 38 without binding.

Further, the construction of probes 12 and 14 is believed to be advantageous according to the preferred teachings of the present invention. Specifically, chamber 88 which may be subjected to pressure or a vacuum to reciprocate pins 80 allows the soft handling of chips 98 in comparison to prior probes which utilized springs to bias the pin in one direction or which utilized physical movement of the probe to push the pin. Further, the use of pin 80 reciprocating in chamber 74 to cause a volume reduction when under vacuum and the elimination of spring biasing forces of prior probes, allows the vacuum applied to pin 80 to retract pin 80 within probes 12 and 14. This is particular advantageous since if chip 98 does not abut the lower end of pin 80, passage 94 is open to the atmosphere. Pin 80 retracts only when chip 98 abuts the lower end of pin 80 to close pin 80 and chamber 74 such that the vacuum will reduce the overall volume of chamber 74 and passage 94 to retract pin 80 within chamber 74. Thus, mechanical control can be easily accomplished by detecting the vacuum pressure applied to chamber 74 and/or by detecting the retraction of pin 80 in signalling attachment to chip 98 by probes 12 and 14.

Further, the method of reciprocation of block 18 and probes 12 and 14 mounted thereon is believed to be particularly advantageous according to the preferred teachings of the present invention. Specifically, block 18 is reciprocated at a sinusoidal rate of velocity due to the pivotal mounting of the end of wire 47 to the free end of crank arm 46 which is rotated by shaft 45 of actuator 42. This sinusoidal drive effect may also be possibly enhanced by electrically controlling actuator 42 to rotate shaft 45 at a sinusoidal rate of velocity. This sinusoidal drive effect allows the velocity of block 18 to approach zero when approaching plates 30 and 34 to prevent the abrupt stopping of block 18 which may shake chips 98 attached to probes 12 and 14 to either detach therefrom or to slip in position relative thereto.

Now that the basic teachings of the present invention have been explained, many extensions and variations will be obvious to one having ordinary skill in the art. For example, although probes 12 and 14 of the type disclosed in the preferred form are believed to be particularly advantageous and produce synergistic results when utilized with invertor 10 according to the teachings of the present invention, invertor 10 may utilize other types and forms of probes according to the teachings of the present invention.

Likewise, it can be appreciated that probes 12 and 14 according to the teachings of the present invention may be utilized in other applications than in invertor 10 of the preferred form where automated handling of chips 98 or other articles is desired.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. Probe for picking up an article comprising, in combination: a housing; a pin for removable attachment to the article; a passage for reciprocally mounting the pin in the housing; an upper portion of the pin which has a cross section which is non-circular; an insert mounted in the passage for slideably receiving the upper portion of the pin and including at least one upstanding tab; and a key slot formed in the housing for receipt of the tab of the insert, with the insert having a shape and size complementary to that of the upper portion for preventing rotation of the pin relative to the housing.

2. The probe of claim 1 wherein the housing comprises, in combination: a chamber portion having a first end and a second end; and a top portion, with a first bore extending from the second end of the chamber portion to a location spaced from the first end, with the top portion enclosing the first bore, with the passage intersecting with the first bore, with the key slot formed in the top portion for receipt of the tab of the insert.

3. The probe of claim 2 further comprising, in combination: a second bore extending from the second end of the chamber portion to a location beyond the first bore and spaced from the first end and of a size for sealing receipt of the insert, with the insert received in the second bore.

4. The probe of claim 3 wherein the top portion and first bore define an upper chamber, with the pin being reciprocal within the upper chamber; and wherein the probe further comprises, in combination: means for providing fluid communication to the upper chamber; and an internal passage in the pin in fluid communication with the upper chamber.

5. The probe of claim 1 wherein the housing further comprises, in combination: means for reciprocating the pin in the housing.

6. The probe of claim 5 wherein the reciprocating means comprises, in combination: a lower chamber formed in the housing, with the pin being reciprocal within the lower chamber; a piston secured to the pin for defining a pressure chamber in the lower chamber; and means for providing fluid communication to the pressure chamber for reciprocating the pin within the housing.

7. Probe comprising, in combination: a housing having a first end and a second end; a first bore extending from the first end of the housing to a location spaced from the second end of the housing; a cylinder tube slideably received in the first bore; a pin; a piston secured to the pin, with the piston being reciprocally received in the cylinder tube for defining a pressure chamber in the first bore and the cylinder tube; means for providing fluid communication to the pressure chamber for reciprocating the pin within the housing; and means received in the housing adjacent to the first end for sealing the cylinder tube with the first bore and for preventing the piston from sliding out of the cylinder tube, with the sealing and preventing means consisting of an O-ring.

8. The probe of claim 7 further comprising, in combination: a passage extending from the first bore for reciprocally mounting the pin in the housing; and an upper portion of the pin which has a cross section which is non-circular, with the upper portion being slideably mounted in the passage having a shape and size complementary to that of the upper portion for preventing rotation of the pin relative to the housing.

9. The probe of claim 8 further comprising, in combination: an insert mounted in the passage for slideably mounting the upper portion of the pin and including at least one upstanding tab; and a key slot formed in the housing for receipt of the tab of the insert.

10. The probe of claim 8 further comprising, in combination: an upper chamber formed in the housing, with the passage interconnecting the first bore and the upper chamber for reciprocal receipt of the pin; an internal passage in the pin in fluid communication with the upper chamber; and means for providing fluid communication to the upper chamber for removably attaching articles to the pin.

11. The probe of claim 10 wherein the means for providing fluid communication to the pressure chamber is independent of the upper chamber.

12. The probe of claim 7 further comprising, in combination: an upper chamber formed in the housing, with a passage interconnecting the first bore and the upper chamber for reciprocal receipt of the pin; an internal passage in the pin in fluid communication with the upper chamber; and means for providing fluid communication to the upper chamber for removably attaching articles to the pin.

13. Probe for picking up an article comprising, in combination: a housing, with the housing divided into an upper chamber and a lower chamber; a pin for removable attachment to the article; means for reciprocally mounting the pin in the housing for reciprocation within the upper and lower chambers; a piston secured to the pin for defining a pressure chamber in the lower chamber; means for providing fluid communication to the upper chamber; means for providing fluid communication to the pressure chamber independent of the upper chamber for reciprocating the pin within the housing; and an internal passage in the pin in fluid communication with the upper chamber and without fluid communication with the pressure chamber for removably attaching the pin to the article.

14. The probe of claim 13 wherein the housing comprises, in combination: a chamber portion having a first end and a second end; and a top portion, with the lower chamber formed by a first bore extending from the first end of the chamber portion to a location spaced from the second end of the chamber portion, with a second bore extending from the second end of the chamber portion to a location spaced from the first bore, with the top portion enclosing the second bore to define the upper chamber, with a passage interconnecting the first and second bores for reciprocal receipt of the pin.

15. The probe of claim 14 further comprising, in combination: an upper portion of the pin which has a cross section which is non-circular, with the upper portion being slideably mounted in the passage having a shape and size complementary to that of the upper portion for preventing rotation of the pin relative to the housing.

16. The probe of claim 15 further comprising, in combination: an insert mounted in the passage for slideably mounting the upper portion of the pin and including at least one upstanding tab; and a third bore extending from the second end of the chamber portion to a location beyond the second bore and spaced from the first bore of a size for sealing receipt of the insert; and a key slot formed in the top portion for receipt of the tab of the insert.

17. The probe of claim 16 further comprising, in combination: a cylinder tube slideably received in the first bore, with the piston being reciprocally received in the cylinder tube; and an O-ring received in the chamber portion adjacent to the first end for sealing the cylinder tube with the first bore, with the O-ring also acting as a stop for preventing the piston from sliding out of the cylinder tube.

* * * * *